(12) United States Patent
Cheng et al.

(10) Patent No.: US 8,748,258 B2
(45) Date of Patent: Jun. 10, 2014

(54) METHOD AND STRUCTURE FOR FORMING ON-CHIP HIGH QUALITY CAPACITORS WITH ETSOI TRANSISTORS

(75) Inventors: Kangguo Cheng, Schenectady, NY (US); Bruce B. Doris, Brewster, NY (US); Ali Khakifirooz, Mountain View, CA (US); Ghavam Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 13/316,635

(22) Filed: Dec. 12, 2011

(65) Prior Publication Data
US 2013/0146959 A1 Jun. 13, 2013

(51) Int. Cl.
*H01L 21/8242* (2006.01)

(52) U.S. Cl.
USPC .......... 438/240; 438/155; 438/239; 438/244; 438/253; 257/310; 257/350; 257/E21.008; 257/E21.411

(58) Field of Classification Search
USPC .................. 257/310, 350, E21.008, E21.411; 438/155, 239, 240, 244, 253
See application file for complete search history.

(56) References Cited

U.S. PATENT DOCUMENTS

| | | | |
|---|---|---|---|
| 6,346,446 B1 | 2/2002 | Ritenour | |
| 6,593,624 B2 | 7/2003 | Walker | |
| 6,881,627 B2 | 4/2005 | Forbes et al. | |
| 6,881,994 B2 | 4/2005 | Lee et al. | |
| 6,888,750 B2 | 5/2005 | Walker et al. | |
| 6,890,812 B2 | 5/2005 | Forbes et al. | |
| 6,894,532 B2 | 5/2005 | Forbes et al. | |
| 6,903,367 B2 | 6/2005 | Forbes | |
| 6,992,349 B2 | 1/2006 | Lee et al. | |
| 6,998,298 B1 | 2/2006 | Horch | |
| 7,015,525 B2 | 3/2006 | Forbes et al. | |
| 7,129,538 B2 | 10/2006 | Lee et al. | |
| 7,202,123 B1 * | 4/2007 | Pan | 438/197 |
| 7,250,646 B2 | 7/2007 | Walker et al. | |
| 7,256,430 B1 | 8/2007 | Horch | |
| 7,288,807 B1 * | 10/2007 | Akamatsu | 257/296 |
| 7,489,002 B2 | 2/2009 | Forbes et al. | |
| 7,525,137 B2 | 4/2009 | Walker et al. | |
| 7,563,715 B2 | 7/2009 | Haukka et al. | |
| 7,709,828 B2 | 5/2010 | Braithwaite et al. | |
| 7,776,697 B2 | 8/2010 | Currie et al. | |
| 7,825,455 B2 | 11/2010 | Lee et al. | |
| 7,846,802 B2 | 12/2010 | Currie et al. | |
| 7,851,861 B2 * | 12/2010 | Tu | 257/350 |
| 7,884,353 B2 | 2/2011 | Currie et al. | |

FOREIGN PATENT DOCUMENTS

| | | |
|---|---|---|
| EP | WO02065522 | 8/2002 |
| EP | WO03015171 | 2/2003 |

* cited by examiner

*Primary Examiner* — Robert Huber
(74) *Attorney, Agent, or Firm* — H. Daniel Schnurmann

(57) ABSTRACT

An ETSOI transistor and a capacitor are formed respectively in a transistor and capacitor region thereof by etching through an ETSOI and thin BOX layers in a replacement gate HK/MG flow. The capacitor formation is compatible with an ETSOI replacement gate CMOS flow. A low resistance capacitor electrode makes it possible to obtain a high quality capacitor or varactor. The lack of topography during dummy gate patterning are achieved by lithography in combination accompanied with appropriate etch.

15 Claims, 4 Drawing Sheets

METHOD AND STRUCTURE FOR FORMING ON-CHIP HIGH QUALITY CAPACITORS WITH ETSOI TRANSISTORS

CROSS-REFERENCE TO RELATED APPLICATIONS

The present application U.S. application Ser. No. 13/316,635 entitled METHOD AND STRUCTURE FOR FORMING ON-CHIP HIGH QUALITY CAPACITORS WITH ETSOI TRANSISTORS is related to the application U.S. Ser. No. 13/316,641, both of which were filed concurrently on Dec. 12, 2011.

FIELD OF THE INVENTION

The present disclosure relates generally to semiconductor devices, and more specifically, to a field-effect transistor (FET) having an on-chip capacitor along with an extremely thin SOI (ETSOI) CMOS transistor, particularly useful for a variety of applications such as system-on-chip (SoC) application.

BACKGROUND AND RELATED ART

With shrinking dimensions of various integrated circuit components, transistors such as FETs have experienced dramatic improvements in both performance and power consumption. These improvements may be largely attributed to the reduction in dimensions of components used therein, which in general translate into reduced capacitance, resistance, and increased through-put current from the transistors.

Nevertheless, performance improvement brought up by this type of "classic" scaling, in device dimensions, has recently met obstacles and in some cases even been challenged, when the scaling goes beyond a certain point, by the increase in leakage current and variability that are inevitably associated with the continued reduction in device dimensions. Planar transistors, such as metal oxide semiconductor field effect transistors (MOSFETs) are particularly well suited for use in high-density integrated circuits. As the size of MOSFETs and other devices decreases, the dimensions of source/drain regions, channel regions, and gate electrodes of the devices, also decrease.

Moreover, extremely thin SOI (ETSOI) devices have been pursued as device architecture for continued CMOS scaling. To render ETSOI a true technology, on-chip capacitor is needed along with ETSOI CMOS transistors for a variety of applications such as system-on-chip (SoC) application.

Silicon-on-insulator (SOI) technology allows the formation of high-speed, shallow junction devices. In addition, SOI devices improve performance by reducing parasitic junction capacitance. In an SOI substrate, a buried oxide (BOX) film made of silicon oxide is formed on single crystal silicon, and a single crystal silicon thin film is formed thereon. Various methods of fabricating such SOI substrates are known, one of which is Separation-by-Implanted Oxygen (SIMOX) process, wherein oxygen ions are implanted into a silicon substrate at a desired depth to form a BOX film. The substrate is then annealed at high temperature, typically 1300° C. and an inert ambient with a small amount of oxygen, so that the oxygen-implanted region of the substrate is converted into silicon oxide. Another method of forming an SOI substrate is wafer bonding, wherein two semiconductor substrates with silicon oxide surface layers are bonded together at the silicon oxide surfaces to form a BOX layer between the two semiconductor substrates, followed by thinning ETSOI, a fully depleted device uses an ultra-thin silicon channel wherein the majority carriers are fully depleted (FD) during operation.

Referring to FIG. 1, there is shown a prior art illustrative structure of an FET device on a semiconductor-on-insulator (SOI) substrate are described having an extremely thin semiconductor-on-insulator (ETSOI) layer. The (ETSOI) layer is present atop the buried insulating layer of an SOI substrate, the ETSOI layer having a thickness preferably ranging from 3 nm to 20 nm. The raised source regions and raised drain regions are formed on an upper surface of ETSOI layer in which the semiconductor is present, preferably formed using an epitaxial deposition process.

Due to the high resistance of the undoped extremely thin SOI body, prior ETSOI capacitors suffer from a high body resistance resulting in poor quality. To render ETSOI a true technology, there is a need in industry for a high quality on-chip capacitor integrated with ETSOI CMOS transistors for a variety of applications such as system-on-chip (SoC) application.

SUMMARY

In one aspect, an embodiment of the invention provides a method and a structure for integrating high-quality capacitors on the same chip as an extremely thin SOI transistor having a thin BOX.

In another aspect, an embodiment provides inventive capacitors formed by using a replacement gate. After removing the dummy gate, the ETSOI and thin BOX layers are recessed to expose a heavily doped back gate region. The high-k/metal gate is then formed along with the standard replacement HK/MG processes. The heavily doped back gate region is used to form the body of the capacitors to reduce the body resistance of the capacitors, thereby improving the capacitor and/or varactor quality.

In another aspect, an embodiment of the invention provides a method and structure for integrating high-quality capacitors/varactors on the same chip as the ETSOI transistors on a thin BOX. The inventive capacitors are formed by using replacement gate. After removing the dummy gate, the ETSOI and thin BOX layers are recessed to expose the heavily doped back gate region. High-k/metal gate is then formed along with the standard replacement HK/MG processes. The heavily doped back gate region which is used as the body of the capacitors to reduce the body resistance of the capacitors and thus it improves the capacitor quality.

The inventive capacitor can be a varactor, also known as a capacitor having a variable capacitance, providing an electrically controllable capacitance, which can be used in tuned circuits.

In another embodiment, the inventive capacitors are formed employing a high quality capacitor by using the metal gate and heavily doped raised source/drain as two electrodes with high-k gate dielectric as capacitor dielectric.

In another embodiment, devices are fabricated in the substrate below the BOX. In an embodiment an MIS capacitor is formed in the SOI substrate. In one embodiment, the semiconductor device can be a contact, a diode or a junction varactor.

In another embodiment, an etched region is backfilled with epitaxial silicon or silicon alloy to have the surface approximately coplanar with other FETs, having the aforementioned device constructed in the epitaxial layer.

In still another embodiment, a semiconductor structure on a SOI substrate includes an extremely thin semiconductor-on-insulator (ETSOI) transistor formed on the SOI substrate; and a capacitor on the SOI substrate integrated with the ETSOI transistor, having a first electrode formed by a doped back gate region of the ETSOI, a second electrode formed by a metal gate replacing a dummy gate, and a replacement high-K dielectric separating the first and second electrode.

In still another embodiment, a method of forming an on-chip semiconductor structure includes forming on an ETSOI layer on the SOI substrate a dummy gate in both a transistor region and in a capacitor region, and surrounding each of the dummy gates by spacers; forming on the ETSOI layer a raised source and drain, the raised source and drain abutting at the spacers; removing by etching the dummy gates from the transistor region, and recessing to remove the ETSOI and thin BOX from the capacitor region; depositing a high-K dielectric and a metal gate in the gate in the transistor region, and in the recessed capacitor region.

BRIEF DESCRIPTION THE DRAWINGS

The following detailed description, given by way of example and not intended to limit the invention solely thereto, will best be appreciated in conjunction with the accompanying drawings, wherein like reference numerals denote like elements and parts, in which.

Figure 7:
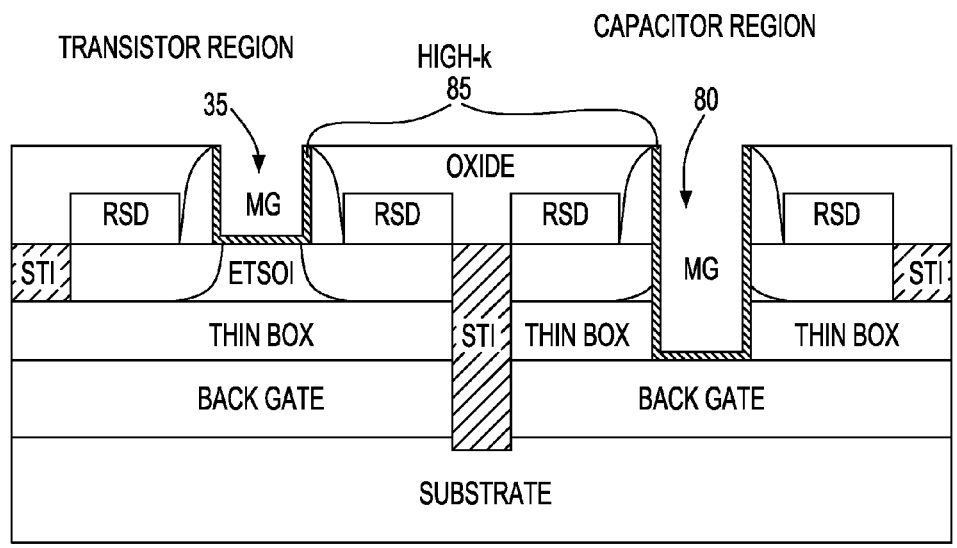
Figure 8:
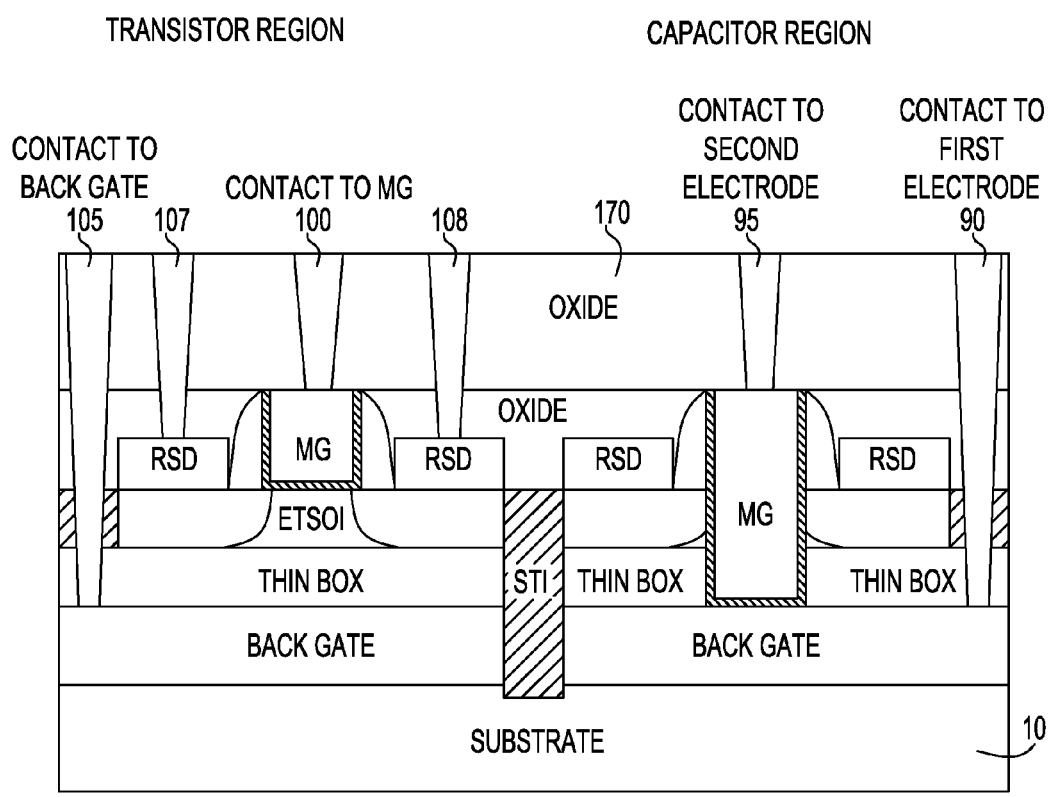

FIG. 7 is a side cross-sectional view of the structure with the mask being removed from the transistor region followed by the deposition of a high-K (HK) dielectric and metal gate (MG); and FIG. 8 is a side cross-sectional view showing an illustration of a deposition of a dielectric and the formation of contacts to the metal gate, the source and drain and the back gate, according to an embodiment of the invention.

DETAILED DESCRIPTION

Detailed embodiments of the present invention are disclosed hereinafter. It is to be understood that they are merely illustrative of the invention that may be embodied in various forms. In addition, each of the examples given in connection with the various aspects of the invention is intended to be illustrative, and not restrictive. Further, the figures are not necessarily drawn to scale, some features may be exaggerated to show details of particular components. Therefore, specific structural and functional details disclosed herein are not to be interpreted as limiting, but merely as a representative basis for teaching one skilled in the art to variously employ the present invention.

Figure 1:
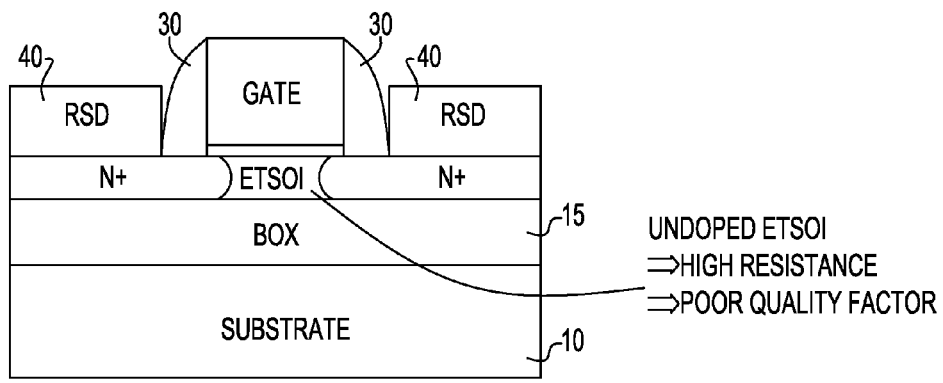
FIG. 1 is a side cross-sectional view of a prior art ETSOI device formed on a semiconductor-on-insulator (SOI) substrate having a raised S/D and an extension thereof.
Figure 2:
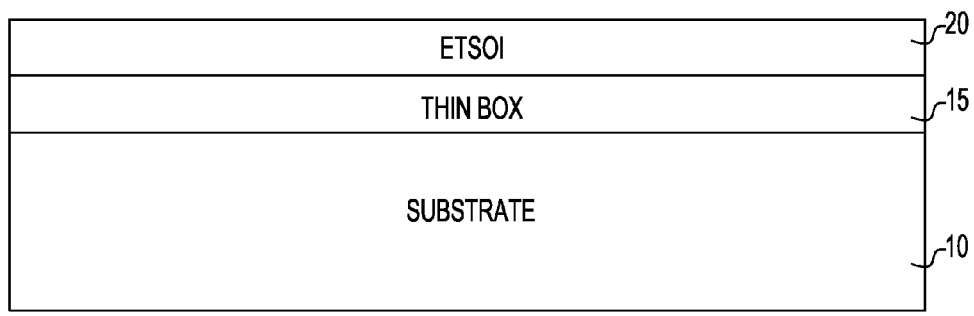
FIG. 2 illustrates an SOI an SOI wafer of an ETSOI showing a thin BOX layer and an ETSOI layer superimposed thereon.

Referring to FIG. 2, an illustrative structure and a method for forming semiconductor FET devices on a semiconductor-on-insulator (SOI) substrate are described, the structure having thereon an extremely thin semiconductor-on-insulator (ETSOI) layer 20. The ETSOI layer is deposited atop the buried insulating layer 15 of the SOI substrate, having a thickness preferably ranging from 2 nm to 20 nm, and more preferably from 4 to 10 nm.

The ETSOI layer 20 is preferably made of any semiconducting material including, but not limited to Si, strained Si, SiC, SiGe, SiGeC, Si alloys, Ge, Ge alloys, GaAs, InAs, and InP, or any combination thereof. The ETSOI layer 20 may be thinned to a desired thickness by planarization, grinding, wet etch, dry etch, oxidation followed by oxide etch, or any combination thereof. Another method of thinning the ETSOI layer 20 consists of oxidizing silicon by a thermal dry or wet oxidation process, and then wet etching the oxide layer using preferably a hydrofluoric (HF) acid mixture. This process can be repeated to achieve the desired thickness. The ETSOI layer 20 can have a thickness ranging from 1.0 nm to 10.0 nm, or in another instance, a thickness ranging from 1.0 nm to 5.0 nm, or in still another, a thickness ranging from 3.0 nm to 8.0 nm.

The thin Buried oxide (BOX) layer 15 on a bulk substrate 10 can be made as a silicon oxide, a nitride, a silicon nitride, and/or an oxynitride, e.g., silicon oxynitride, having a thickness ranging from 5 nm to 80 nm, or preferably, from 10 nm to 50 nm, and still more preferably, from 10 nm to 25 nm.

Still referring to FIG. 2, the SOI wafer can be made by wafer-bonding or SIMOX technique. The ETSOI layer may comprise any semiconducting material including, but not limited to Si, strained Si, SiC, SiGe, SiGeC, Si alloys, Ge, Ge alloys, GaAs, InAs, and InP, or any combination thereof.

Figure 3:
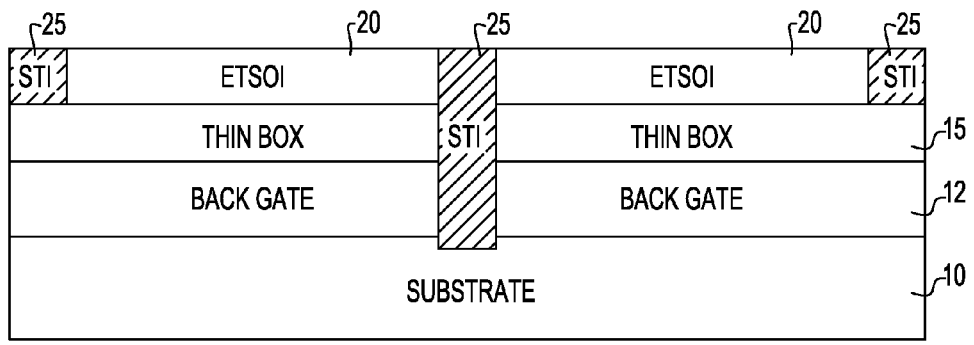
FIG. 3 shows a shallow trench isolation (STI) and the formation of a back gate preferably by implantation.

Referring to FIG. 3, an isolation can be formed by shallow trench isolation (STI) process including patterning (e.g., deposition a sacrificial pad layer (e.g., pad oxide and pad nitride), patterning (e.g., by lithography) and etching STI trenches 25 (e.g., by reactive ion etch (RIE), filling the trenches with one or multiple insulators including but not limited to oxide, nitride, oxynitride, high-k dielectric, or any suitable combination of those materials. A planarization process, such as chemical-mechanical polishing (CMP), may optionally be used to provide a planar structure. Besides STI 25, other isolation such as mesa isolation, local oxidation of silicon (LOCOS) can also be used. The sacrificial pad oxide and pad nitride can then be striped.

A back gate 12 can be formed by ion implantation followed by thermal anneal to activate dopants, wherein the back gate dopants include arsenic and phosphorus for n-type doping, and boron, indium for p-type doping. The doping concentration ranges from $5 \times 10^{17}$ cm−3 to $5 \times 10^{19}$ cm−3, more preferably $2 \times 10^{18}$ cm−3 to $1 \times 10^{19}$ cm−3. The back gate thickness (vertically) ranges from 25 nm to 150 nm, more preferably 35-80 nm, below the back side of the BOX layer 15.

Figure 4:
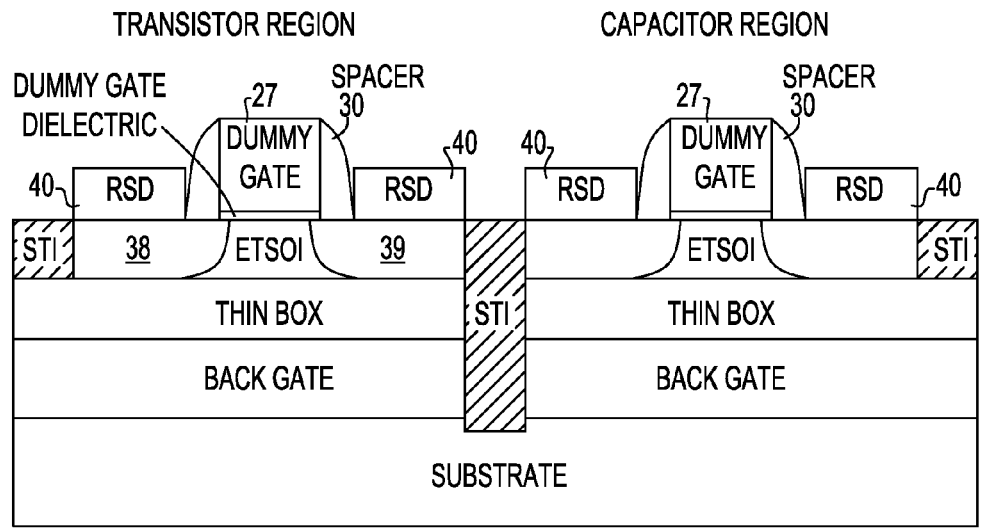
FIG. 4 illustrates a transistor region and a capacitor or varactor region separated from each other by an STI, each of which is provided with a dummy capacitor surrounded by a raised source and drain (RSD), according to one embodiment of the present invention.

Referring to FIG. 4, a dummy gate 27 is formed in the transistor region and the capacitor region. The dummy gate dielectric 27 may comprise silicon oxide formed by oxidation; thickness ranges from 1 nm to 5 nm. The dummy gate may comprise polysilicon formed by deposition such as chemical vapor deposition (CVD), thickness ranges from 10 nm to 70 nm, more preferably 20-50 nm. The dummy gate 27 may further comprise a silicon nitride cap on top of the polysilicon. Silicon nitride can be formed by CVD deposition, with a thickness ranges from 5-50 nm, more preferably from 20-30 nm. The dummy gate 15 is formed by conventional patterning and etching processes. Embodiments with other materials suitable for dummy gate are also conceived.

Spacers 30 are then formed, typically composed of dielectric materials, and preferably formed using a blanket layer deposition and anisotropic etchback. Although the spacers are depicted in the figures as each being a single layer, embodiments have been contemplated in which the spacers are each a multi-layered structure of dielectric materials. In one embodiment, spacers are preferably formed by depositing a film (e.g., silicon nitride) formed by RIE. Spacer thickness ranges from 3-20 nm, and more preferably 4 to 8 nm.

An epitaxially grown raised source/drain (RSD) 40 and an extension are formed, wherein the RSD is preferably made of Si or SiGe. It can be made in-situ doped or doped following the epitaxy, preferably by implantation and plasma doping. The RSD thickness varies from 10-30 nm. Extension can be formed by implantation or by driving dopants from the in-situ doped RSD.

More particularly, the diffusing dopant from the in-situ doped semiconductor material of the raised source region 38 and the raised drain region 39 into the ETSOI layer 20 to form extension regions 45. The dopant from the in-situ doped semiconductor material is diffused into the ETSOI layer 20 by an annealing processes including, but not limited to, rapid thermal annealing, furnace annealing, flash lamp annealing, laser annealing, or any suitable combination of thereof. Thermal annealing to diffuse the dopant from the in-situ doped semiconductor material into the ETSOI layer 20 is conducted at a temperature ranging from 850° C. to 1350° C.

In-situ doped semiconductor material is doped to a p-type conductivity, the extension regions 45 that are formed in the ETSOI layer 20, the dopant concentration of the extension regions 45 having the p-type conductivity ranges from $1\times10^{19}$ atoms/cm$^3$ to $2\times10^{21}$ atoms/cm$^3$. The extension regions 45 having material with a dopant concentration ranging from $2\times10^{19}$ atoms/cm$^3$ to $5\times10^{20}$ atoms/cm$^3$.

The extension regions 45 have a depth that extends the entire depth of the ETSOI layer 20. The extension regions 45 have preferably a depth of less than 10 nm, typically being 2 nm to 8 nm in depth, as measured from the upper surface of the ETSOI layer 20. Although the extension regions 45 are described above as being formed by diffusing dopant from the raised source region 38 and the raised drain region 39 into the ETSOI layer 20, the extension regions 45 may also be formed by ion implanting of n-type or p-type dopants into the ETSOI layer 20 after forming dummy gate 27, and before forming the raised source region 39 and the raised drain region 40.

Figure 5:
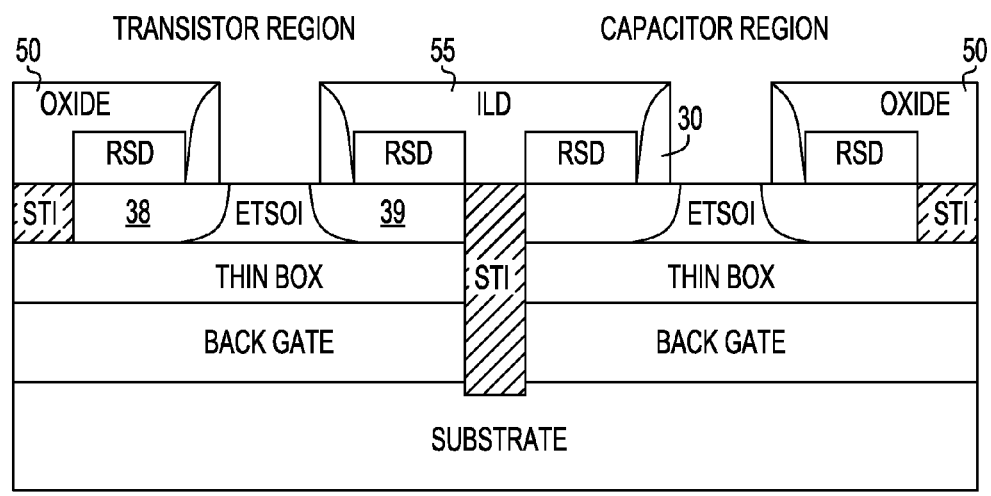
FIG. 5 shows a side cross-sectional view of a demonstrative illustration of an interlevel dielectric layer (ILD) deposited and planarized stopping on the dummy gates.

Referring to FIG. 5, a deposition and planarization of an interlevel dielectric (ILD, e.g., oxide) follow, stopping at the dummy gate. The deposition can be performed using CVD, by spin-on coating, and the like. The planarization can be done preferably using a chemically mechanical polish (CMP). This process is then followed by removing the dummy gates 25.

Referring to the removal of the dummy gates 25, a silicon nitride cap, if used, can be removed by etching, preferably by dry etch (e.g., RIE), or wet etch by hot phosphoric acid. The polysilicon can be removed by dry etch (e.g., RIE) or wet etch (e.g., TMAH or ammonia), and the dummy gate oxide by hydrofluoric acid or chemical oxide removal.

Referring to the wet etch process, it can be performed with an etch solution containing hydrofluoric in the presence of silicon oxide. Alternatively, dry etch such as chemical oxide removal (COR) to etch the polysilicon and the dummy gate oxide.

In one demonstrative illustration, the chemical oxide removal (COR) process may include exposing the structure to a gaseous mixture of hydrofluoric acid (HF) and ammonia (NH4OH). The ratio of hydrofluoric acid (HF) to ammonia (NH4OH) in the chemical oxide removal (COR) process may range from 2.25:1 to 1.75:1 at a pressure between 0.75 mTorr and 15 mTorr at approximately room temperature (25° C.). In one example, the ratio of hydrofluoric acid (HF) to ammonia (NH4OH) in the chemical oxide removal (COR) is 2:1, at a pressure between 1 mTorr and 10 mTorr and a temperature of about 25° C. During this exposure, HF and ammonia gases react with the sidewall residue that is present on the exposed surface of the dielectric film from the etch process that produced the dummy gate to form a solid reaction product. The solid reaction product can be removed in a second step which includes heating the structure to a temperature greater than about 90° C., e.g., 100° C., thus causing the reaction product to evaporate. The reaction product may be removed by rinsing the structure in water, or removing with an aqueous solution.

Figure 6:
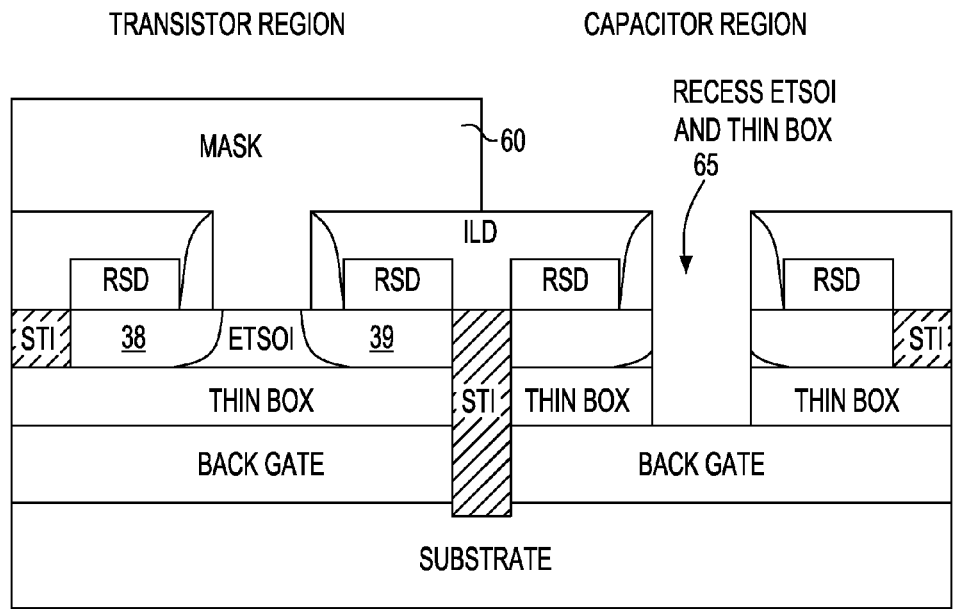
FIG. 6 depicts a side cross-sectional views showing an illustration of a block mask covering the transistor region leaving the capacitor region exposed, followed by recessing the ETSOI and thin BOX layers.

Referring to FIG. 6, a block mask 60 is used to cover the transistor region and expose the capacitor region. The mask 60 may be a soft mask, i.e., photoresist, formed by photolithography. If, alternately, a hard mask is used, photoresist material is applied over the masking layer to effect patterning the hard mask layer. The mask 60 can be a softmask (photoresist) formed by photolithography.

Referring to the recess to remove ETSOI and thin BOX from the capacitor region, the ETSOI and thin BOX layers can be recessed, preferably by RIE, when removing a portion of the material within a narrow opening portion.

Referring to FIG. 7, the mask (photoresist) 60 is removed, preferably dry strip (plasma etch) or wet strip (by sulfuric peroxide).

A high-k dielectric 85 and 80 metal gate (MG) are now deposited. The high-k dielectric material may be deposited by standard methods known in the art, such as atomic layer deposition (ALD) or chemical vapor deposition (CVD). Alternatively, the dielectric material may include a silicon containing dielectric material deposited by chemical vapor deposition, such as low pressure chemical vapor deposition (LPCVD) and optionally, in combination with chemical oxidation, thermal oxidation and/or thermal nitridation.

With reference to the capacitor, the back gate 12 (highly doped region below thin box) becomes the first electrode, metal gate 80 the 2nd electrode, and the high-k 85 becomes the capacitor dielectric. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum or aluminum.

Examples of metal gate include tungsten, titanium, tantalum, ruthenium, zirconium, cobalt, copper, aluminum, lead, platinum, tin, silver, gold, a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition.

Referring to FIG. 8, a dielectric (e.g., oxide) 110 is deposited, preferably using CVD, spin-on coating, and the like. The contact to the metal gate 100, source/drain (S/D) 107 and 108, and back gate 105 (silicide on S/D (not shown) can be formed either before or during the contact formation. By way of illustration, a back gate electrode is preferably formed by deposition of a conductive material, followed by a recess etch that removes a portion of the conductive material. The conductive material may be, but is not limited to a doped semiconductor material (e.g., polycrystalline or amorphous silicon, germanium, and a silicon germanium alloy), a metal (e.g., tungsten, titanium, tantalum, ruthenium, cobalt, copper, aluminum, lead, platinum, tin, silver, and gold), a conducting metallic compound material (e.g., tantalum nitride, titanium nitride, tungsten silicide, tungsten nitride, titanium nitride, tantalum nitride, ruthenium oxide, cobalt silicide, and nickel silicide), or any suitable combination of these materials.

Contacts are formed by patterning (e.g., lithography), etching contact trenches (e.g., by RIE), filling the trenches with conductive material such as W, WN, TiN, TAN, and the like, and is followed by planarizing (e.g., by CMP).

Still referring to the structure shown in FIG. 8, in a second embodiment, the structure can be modified by eliminating the formation of the back gate. The formation of the structure further differs from the embodiment illustrated in FIG. 8 by having the BOX directly superimposed over the substrate, and extending preferably from the beginning of the transistor region abutting to the end of the capacitor region (i.e., without being separated by the STI as shown in FIG. 8).

Regarding the capacitor/varactor, the highly doped RSD becomes the first electrode, the metal gate (MG) the 2nd electrode, and the high-k, the capacitor dielectric.

In summary, the embodiments of the present invention disclose a capacitor formation compatible with ETSOI replacement gate CMOS Flow. As explained, the low resistance capacitor electrode is instrumental in providing a high quality capacitor and/or varactor. Furthermore, since no topography is used while dummy gate patterning enables both the lithography and the etch to be users friendly.

While the structures and the methods disclosed herein have been particularly shown and described with respect to preferred embodiments thereof, it will be understood by those skilled in the art that the foregoing and other changes in forms and details may be made without departing from the spirit and scope of the present disclosure. It is therefore intended that the methods and structures disclosed herein not be limited to the exact forms and details described and illustrated, but fall within the scope of the appended claims.

What is claimed is:

1. A method of forming an on-chip semiconductor structure comprising:
    forming on an ETSOI layer of an SOI substrate, a first dummy gate in both a transistor region and a second dummy gate in a capacitor region, surrounding each of said dummy gates by spacers;
    forming on said ETSOI layer a raised source and drain (RSD), said RSD abutting at said spacers;
    removing by etching said first dummy gate from said transistor region, and recessing by etching to remove said ETSOI and a thin BOX layer from said capacitor region, including said second dummy gate; and
    depositing a high-K dielectric and a metal gate in said gate in said transistor region, and in said recessed capacitor region.

2. The method of claim 1, further comprising following said forming said raised source and drain, an interlevel dielectric is deposited and planarized, abutting at said dummy gate.

3. The method of claim 1, wherein said removing said dummy gates is performed by dry or wet etching.

4. The method of claim 1 further comprising covering said transistor region by a block mask and leaving said capacitor region exposed.

5. The method of claim 4 further comprising removing said bock mask.

6. The method of claim 5, further comprises using photoresist to remove said block mask using plasma etch to dry strip or a sulfuric peroxide to wet strip.

7. The method of claim 1, further comprising forming a capacitor using a first electrode formed by a back gate below said thin BOX layer of said SOI substrate; a second electrode formed by said metal gate; and said high-K dielectric forming a capacitor dielectric.

8. The method of claim 1, further comprising forming contacts to said metal gates, raised source and drain.

9. The method of claim 1 wherein said recessed dummy gate, ETSOI and thin BOX layers expose a heavily doped back gate region.

10. The method of claim 1 wherein said high-k and said metal gate are formed by a replacement high-k and metal gate process.

11. The method of claim 9 wherein said exposing said heavily doped back gate region forms a body of a capacitor, reducing said capacitor body resistance, and wherein said capacitor uses said metal gate and doped raised source and drain as a first and second electrode, and having said high-k gate dielectric as capacitor dielectric.

12. The method of claim 1 wherein said high-K dielectric is made of metal oxide or dielectric materials.

13. The method of claim 1 wherein said spacers are formed by depositing a film or by using a blanket layer deposition and anisotropic etchback.

14. The method of claim 1 wherein said RSD are grown epitaxially, forming an extension.

15. The method of claim 14, further comprising forming said extension by implantation or by driving dopants from an in-situ doped RSD, said dopants comprising lanthanum or aluminum.

* * * * *